April 7, 1970 T. J. KILDUFF ETAL 3,505,144
METHOD OF MAKING ELECTRICALLY CONDUCTIVE
PRESSURE SENSITIVE ADHESIVE TAPES
Original Filed Oct. 8, 1964

INVENTORS,
TIMOTHY J. KILDUFF
ALLAN M. BIGGAR
BY Harry M. Saragovitz,
Edward J. Kelly, Herbert Berl
& J. D. Edgerton
ATTORNEYS United States Patent Office 3,505,144

Patented Apr. 7, 1970

3,505,144

METHOD OF MAKING ELECTRICALLY CONDUCTIVE PRESSURE SENSITIVE ADHESIVE TAPES

Timothy J. Kilduff, 2703 Queens Chapel Road, Mount Rainier, Md. 20822, and Allan M. Biggar, 3121 N. Oakland St., Arlington, Va. 22310

Original application Oct. 8, 1964, Ser. No. 402,668, now Patent No. 3,355,545, dated Nov. 28, 1967. Divided and this application Aug. 25, 1967, Ser. No. 672,948
Int. Cl. B32b *31/08, 31/12, 15/02*
U.S. Cl. 156—259 4 Claims

ABSTRACT OF THE DISCLOSURE

A method for making an electrically conductive pressure sensitive tape essentially comprising a thin flexible strip of backing material with a layer of pressure sensitive adhesive coating one side of the backing material and a metal mesh embedded in the adhesive.

Figure 1:
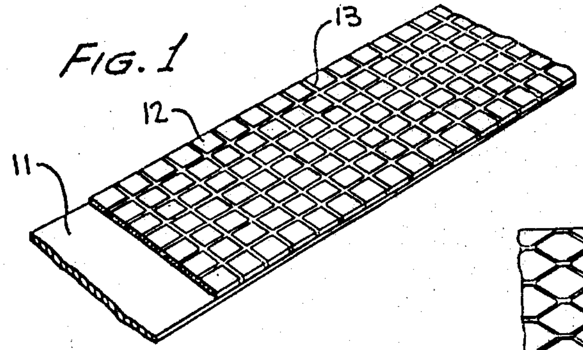

The invention described herein may be manufactured and used by or for the Government of the United States of America for governmental purposes without the payment to us of any royalty thereon.

This application is a division of application Ser. No. 402,668 filed Oct. 8, 1964, now Patent No. 3,355,545.

This invention relates generally to adhesive tapes, and more particularly to electrically conductive pressure sensitive adhesive tapes.

Electrically conductive pressure sensitive adhesive tapes which make electrical contact on the adhesive side of the tape have a spectra of uses which are virtually as broad as the electrical arts themselves. For example, such tapes may be used for making temporary or semi-permanent electrical connections when setting up electrical equipment in field installations. These tapes may also be used to make temporary electrical repairs such as repairs to printed circuit boards. When used as electrical conductors similar to ribbon cables, electrically conducting adhesive tapes greatly simplify cabling problems between units in a larger electrical system. When provided in very wide rolls, they may be easily applied to provide highly effective R-F shielding. These tapes enjoy a particular advantage when low temperature electrical connections are required such as connections to temperature sensitive electrical components like selenium rectifiers, capacitors, and batteries where soldering temperatures would result in damage to the components. Other applications and uses will readily suggest themselves to those skilled in the art.

Electrically conducting adhesive tapes which make electrical contact on the adhesive side have in the past been made by mixing a metallic powder such as a silver powder with an adhesive to impart the characteristic of electrical conductivity to the adhesive and applying the adhesive to one side of a thin, flexible strip of metal such as copper. This tape, while generally adequate, for many purposes, suffers several disadvantages. It is difficult to manufacture because of the many problems involved in the grinding and mixing operations of the metallic powder with the adhesive. As a result, the tape is generally expensive and not economical for use in many temporary repair applications. The cost of the tape is made still higher by the use of silver to make the metallic powder which is necessitated by the requirement that the resistance through the adhesive to the metal backing be as small as possible. Furthermore, these tapes are in fact poor conductors because of the insulating properties of the adhesive which surrounds the metallic particles, and this poor conductivity becomes worse with age since the metallic powder rapidly oxidizes. In addition, the adhesion properties of the tape are greatly decreased due to the metallic powder being mixed in the adhesive. This is a very serious detriment since the adhesion properties are relied on to provide good initial electrical contact.

It is therefore an object of the present invention to provide electrically conducting pressure sensitive adhesive tapes which are simple and inexpensive to produce in mass production.

It is another object of the instant invention to provide electrically conducting pressure sensitive adhesive tapes which have a high electrical conductivity that deteriorates very slowly with age.

It is a further object of this invention to provide electrically conductive pressure sensitive adhesive tapes which have very high adhesion properties to insure good initial electrical contact.

It is yet another object of the invention to provide an economical process of manufacturing in mass production an electrically conducting pressure sensitive adhesive tape having superior electrical and adhesive qualities.

According to the present invention, the foregoing and other objects are attained by providing a tape having a suitable flexible backing which may be either electrically insulating or electrically conducting and to which there has been applied to one side thereof an adhesive and a thin, highly flexible metal mesh such as a copper mesh.

Figure 2A:
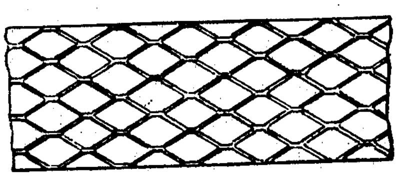
Figure 2B:
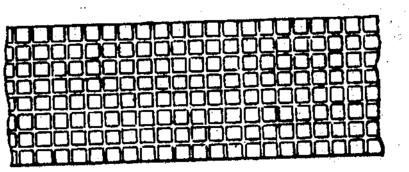
Figure 2C:
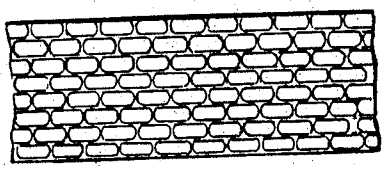
Figure 2D:
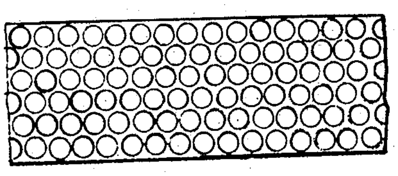
Figure 3:
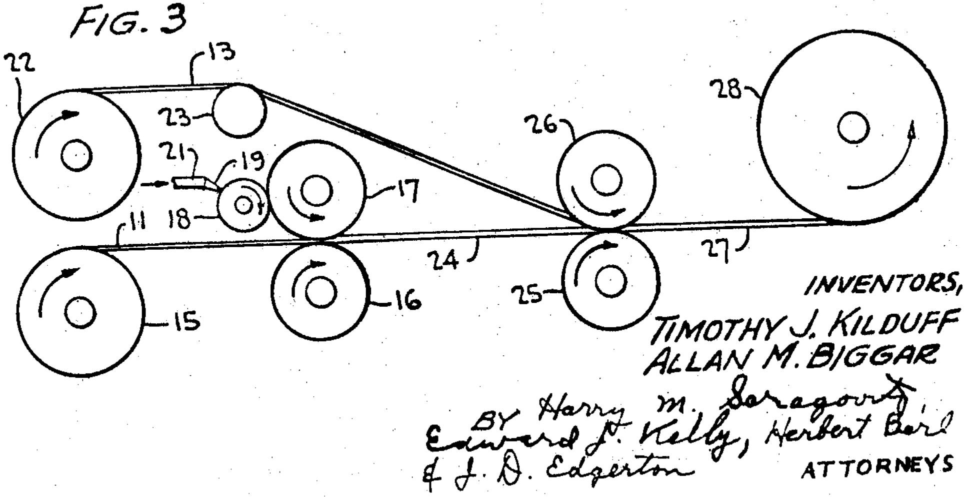

The specific nature of the invention, as well as other objects, aspects, uses and advantages thereof, will clearly appear from the following description and from the accompanying drawing in which:

FIG. 1 is a perspective view on an enlarged scale of an electrically conducting pressure sensitive adhesive tape according to the invention;

FIGS. 2A, 2B, 2C, and 2D are plan views on an enlarged scale of several alternative metal meshes which may be used in the tape; and FIG. 3 shows schematically the process of manufacturing in mass production electrically conducting adhesive tapes according to the invention.

Referring now to the drawing and more particularly to FIG. 1 wherein an electrically conducting adhesive tape according to the invention is shown as having a thin, flexible backing 11. The backing may be made of any number of suitable materials as for example various cloths such as cotton or silk, plastic resins such as cellulose acetate, metal such as copper or aluminum foil, paper, or glass. An adhesive 12 of a uniform thickness covers one side of the tape backing 11. The adhesive is typically a mixture comprising a synthetic elastomeric base material such as a synthetic rubber, polyvinyl ether, or polyacrylate ester, a tackifier and a plasticizer to impart the desired physical characteristics to the adhesive, a filler to decrease the cost, and an antioxidant to lessen the effect of aging. A metal mesh 13, preferably of copper, is embedded in the adhesive 12. The mesh and the adhesive are approximately the same thickness. The adhesive serves to securely hold the metal mesh in intimate contact with a surface to provide a reliable electrical as well as mechanical contact with the surface. The metal mesh, of course, serves as the electrical conductor.

The metal mesh may take any number of forms and may be produced by several methods. FIG. 2A shows a metal mesh produced by an expanding metal technique. Meshes so produced have been made with thicknesses between two and three mils (.002 to .003 inch). The mesh shown in FIG. 2B is produced by etching. Two negatives are placed on either side of a thin sheet of copper foil one to two mils in thickness and aligned. The excess copper is etched away on both sides of the foil to minimize the effects of undercutting in the etching process. FIGS. 2C and 2D show two examples of metal meshes having thicknesses of one mil that have been produced by an electroforming process. In this process a wheel having a positive pattern of the mesh thereon rotates partially submerged in an electrolytic solution. The pattern on the wheel acts as a cathode, and metal is plated on the wheel by electrolysis. The thickness of the mesh can be controlled to a high degree of accuracy by varying the electrolysis current. As the wheel surface comes out of the solution, the metal mesh is peeled off thus forming one continuous strip or sheet of mesh. Perforated metal meshes having thicknesses between two and three mils may be made by punching.

The electrically conducting pressure sensitive adhesive tapes according to this invention lend themselves to easy and economical mass production as is illustrated by FIG. 3. Here, spool 15 holds a supply of tape backing 11 which is continuously drawn through pressure rollers 16 and 17. Pressure roller 17 functions to apply a thin, uniform coating of adhesive to one surface of the backing material. The thickness of the adhesive coating may be varied by adjusting the pressure between the rollers 16 and 17. The surface of pressure roller 17 is constantly supplied with adhesive by spreader roller 18. Adhesive is applied to spreader roller 18 by a wiper 19 which is connected to a reservoir (not shown) of adhesive by conduit 21. Spool 22 holds a supply of metal mesh 13 which is continuously drawn over guide roller 23 and brought into intimate contact with the adhesive side of the adhesive-coated tape backing 24 between pressure rollers 25 and 26. The presure rollers 25 and 26 serve to embed the mesh 13 into the adhesive on the adhesive-coated tape backing 24 to form the resultant electrically conducting tape 27. The tape 27 is then taken up on a receiving or storage spool 28. The tape may be made in any desired width by, for example, providing longitudinal cutters (not shown) just prior to the storage spool. Widths on the order of ⅛ inch are contemplated for repairing applications, while widths of several inches are contemplated for shielding applications.

We claim as our invention:

1. A method of producing electrically conductive pressure sensitive tape wherein an electrically conductive element is embedded in the adhesive which secures the tape to an adjoining surface, said method comprising the steps of apply a uniform coating of pressure sensitive adhesive to one side of a thin, flexible strip of backing material of indefinite length, said adhesive being adapted to secure said backing to an adjoining surface, embedding a thin, flexible metal mesh in said adhesive coating and cutting the resulting tape comprising the backing, adhesive and metal mesh into suitable widths.

2. The method defined in claim 1 wherein said applying step comprises drawing said backing through a first pair of opposed pressure rollers, the surface of one of said rollers being continuously supplied with said adhesive.

3. The method defined in claim 2 comprising the additional step of varying the thickness of said adhesive applied to said backing by varying the pressure between said rollers.

4. The method defined in claim 1 wherein said embedding step comprises bringing the surface of said metal mesh into contact with said adhesive and drawing said adhesive coated backing and said metal mesh through a second pair of opposed pressure rollers.

References Cited

UNITED STATES PATENTS

| | | | |
|---|---|---|---|
| 2,105,440 | 1/1938 | Miller | 204—216 X |
| 2,410,924 | 11/1946 | Blume et al. | 161—89 |
| 2,664,139 | 12/1953 | Speed et al. | 156—259 X |
| 2,722,495 | 11/1955 | Hedges | 161—114 X |
| 2,870,068 | 1/1959 | Schaer | 204—216 X |

JOHN T. GOOLKASIAN, Primary Examiner

R. A. KILLWORTH, Assistant Examiner

U.S. Cl. X.R.

117—122; 156—324; 161—89, 95, 114, 167